United States Patent
Jong et al.

(10) Patent No.: US 12,313,683 B2
(45) Date of Patent: May 27, 2025

(54) CONTROLLING STORAGE OF TEST DATA BASED ON PRIOR TEST PROGRAM EXECUTION

(71) Applicant: Teradyne, Inc., North Reading, MA (US)

(72) Inventors: Katherine R. Jong, Somerville, MA (US); Eric W. Bull, Moorpark, CA (US); Prabhakar Hegde, Acton, MA (US); Jae D. Roh, Andover, MA (US); Andrew J. Staniszewski, Livingston, TX (US); Padmanabha S. Kannampalli, Oak Park, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 18/123,680

(22) Filed: Mar. 20, 2023

(65) Prior Publication Data

US 2024/0319275 A1 Sep. 26, 2024

(51) Int. Cl.
*G01R 31/319* (2006.01)
*G06F 11/22* (2006.01)
*G06F 11/3668* (2025.01)

(52) U.S. Cl.
CPC .... *G01R 31/31908* (2013.01); *G06F 11/2273* (2013.01); *G06F 11/3688* (2013.01)

(58) Field of Classification Search
CPC ........... G01R 31/31908; G06F 11/2273; G06F 11/3688
USPC .......................................... 714/738, 741, 742
See application file for complete search history.

(56) References Cited

U.S. PATENT DOCUMENTS

| | | | |
|---|---|---|---|
| 5,801,972 A * | 9/1998 | Konno | G01R 31/318307 714/724 |
| 9,116,785 B2 | 8/2015 | Ferry | |
| 12,008,234 B2 | 6/2024 | Schaber et al. | |
| 2003/0084388 A1 | 5/2003 | Williamson et al. | |
| 2004/0177302 A1 | 9/2004 | Mori et al. | |
| 2005/0022065 A1 | 1/2005 | Dixon et al. | |
| 2007/0294581 A1 | 12/2007 | Dean et al. | |
| 2008/0229162 A1 | 9/2008 | Hata et al. | |
| 2008/0303173 A1 * | 12/2008 | Hamada | G01R 31/318555 257/E21.531 |
| 2012/0198292 A1 | 8/2012 | Yazurihara et al. | |
| 2014/0281776 A1 | 9/2014 | Champion et al. | |

(Continued)

FOREIGN PATENT DOCUMENTS

KR 1020200077401 A 6/2020

OTHER PUBLICATIONS

Jun et al., CSDA: An Adaptive Data Storage Strategy for Predictive branch Path on Multi-Core Architecture, 2010, IEEE, pp. 1695-1702. (Year: 2010).*

(Continued)

*Primary Examiner* — John J Tabone, Jr.
(74) *Attorney, Agent, or Firm* — ArentFox Schiff LLP

(57) ABSTRACT

An example system includes a first memory that includes primary storage; a second memory that includes secondary storage; and a control system for predicting paths through a test program that will be taken during a planned execution of the test program, and for causing test data associated with the test program to be stored in the first memory or the second memory based on the paths predicted.

29 Claims, 3 Drawing Sheets

(56) References Cited

U.S. PATENT DOCUMENTS

| | | | |
|---|---|---|---|
| 2016/0026653 A1 | 1/2016 | Caro et al. | |
| 2016/0034403 A1* | 2/2016 | Chong | G11C 7/08 |
| | | | 711/122 |
| 2021/0027189 A1* | 1/2021 | Alshawabkeh | G11C 29/36 |
| 2022/0308793 A1* | 9/2022 | Hou | G06F 3/0604 |
| 2022/0319606 A1 | 10/2022 | Sarpatwari et al. | |
| 2023/0146534 A1* | 5/2023 | Schaber | G06F 12/0638 |
| | | | 711/154 |

OTHER PUBLICATIONS

Wang et al., Understanding and Optimizing Conjunctive Predicates Under Memory-Efficient Storage Layouts, Jun. 2021, IEEE, vol. 33, No. 6, pp. 2803-2817. (Year: 2021).*
File History of U.S. Appl. No. 17/523,175 downloaded from Patent Center on Jan. 2, 2024, 185 pages.
International Search Report and Written Opinion in Application No. PCT/US2022/048948 dated Mar. 2, 2023, 9 pages.
Wikipedia "Memory hierarchy" page, retrieved from https://en.wikipedia.org/wiki/Memory_hierarchy (Year: 2023), 4 pages.
International Search Report for related Application No. PCT/US2024/019364 mailed Jun. 28, 2024 (3 pgs).
Written Opinion of the International Searching Authority for related Application No. PCT/US2024/019364 mailed Jun. 28, 2024 (4 pgs.).
File History of U.S. Appl. No. 17/523,175 from Feb. 14, 2024 through Jul. 18, 2024. Downloaded Oct. 9, 2024. 64 pages.

* cited by examiner

CONTROLLING STORAGE OF TEST DATA BASED ON PRIOR TEST PROGRAM EXECUTION

TECHNICAL FIELD

The specification is directed to controlling storage of test data based on prior test program execution.

BACKGROUND

Test systems are configured to test the operation of electronic devices referred to as devices under test (DUTs). An example test system may include test instruments to send signals that include commands and data to a DUT for testing. The commands and data are generated by executing a test program. Data for use by the test program may be stored in, and obtained from, memory on the test system. For example, memory storing test data may be located on each test instrument.

SUMMARY

An example system includes a first memory that includes primary storage; a second memory that includes secondary storage; and a control system for predicting paths through a test program that will be taken during a planned execution of the test program, and for causing test data associated with the test program to be stored in the first memory or the second memory based on the paths predicted. The example test system may include one or more of the following features, either alone or in combination.

Causing the test data to be stored may include causing the test data to be stored in the first memory. Causing the test data to be stored may include: causing at least some of the test data to be moved from the first memory to the second memory prior to the planned execution; and causing the at least some of the test data to be moved from the second memory back to the first memory based on a time of the planned execution.

The at least some of the test data may be caused to be moved from the first memory to the second memory based on a storage capacity of the first memory. The at least some of the test data may be caused to be moved from the first memory to the second memory prior to the planned execution when the first memory is full. The at least some of the test data may be caused to be moved from the first memory to the second memory when the first memory does not have enough storage capacity for both the at least some of the test data and other test data. The other test data may be predicted to be needed by the test program before the at least some of the test data. The at least some of the test data may be caused to be moved from the second memory back to the first memory at a time prior to the time of the planned execution. The second memory may have greater storage capacity than the first memory.

The control system may include a model for predicting the paths through the test program. The model may include at least one of a probability model, a Markov model, a Bayesian model, or a machine learning model. The model may include parameters that are obtained through a static analysis of the test program. The parameters may be weighted based on historical data. The historical data may be based on prior executions of the test program.

The control system may be configured to perform operations that include: performing a static analysis of the test program, where the static analysis identifies first paths through the test program that could be taken during a hypothetical execution of the test program; obtaining historical data that is based on second paths through the test program that have been taken during past executions of the test program; and weighting the first paths based on the historical data to produce a model. Predicting the paths through a test program may be performed based on the model. Performing the static analysis may include identifying a branch in the test program. The branch may split into multiple paths that the test program may follow. The first paths may include the multiple paths. The test program may be packaged with the historical data and the test data. The historical data may be obtained from the test program.

An example method includes: performing a static analysis of a test program, where the static analysis identifies first paths through the test program that could be taken during a hypothetical execution of the test program; obtaining historical data that is based on second paths through the test program that have been taken during past executions of the test program; weighting the first paths based on the historical data to produce a model; using the model to predict third paths through the test program that will be taken during a planned execution of the test program; and storing test data associated with the test program in memory based on the third paths. The method may include one or more of the following features, either alone or in combination.

The memory may include first memory and second memory. Storing the test data may include storing the test data in the first memory. At least some of the test data may be retrieved from the first memory during the execution of the test program. The method may include moving the at least some of the test data from the first memory to the second memory prior to the planned execution; and moving the at least some of the test data from the second memory back to the first memory based on a time of the planned execution. The at least some of the test data may be moved from the first memory to the second memory when the first memory is full. The at least some of the test data may be moved from the first memory to the second memory when the first memory does not have the storage capacity for both the at least some of the test data and other test data. The other test data may be predicted to be needed by the test program before the at least some of the test data. Moving the at least some of the test data from the second memory back to the first memory may occur prior to the time of the planned execution.

The second memory may have greater storage capacity than the first memory. Performing the static analysis may include identifying a branch in the test program. The branch may split into multiple paths that the test program may follow. The first paths may include the multiple paths. The model may include at least one of a probability model, a Markov model, a Bayesian model, or a machine learning model. The test program may be packaged with the historical data and the test data. The historical data may be obtained from the test program.

An example system includes a first memory comprising primary storage; a second memory comprising secondary storage storing multiple test programs; and a control system for determining which of the multiple test programs to copy to the first memory based on one or more factors, and to copy one or more of the test programs from the second memory to the first memory based on the one or more factors. The system may include one or more of the foregoing features, either alone or in combinations. The one or more factors may be or include user input, an identity of a device to be tested by the one or more test programs, and/or an identity of a manufacturer of a device to be tested by the one or more test programs.

The control system may be configured to receive information to authenticate a user prior to copying one or more of the multiple test programs to the first memory. The multiple test programs in the secondary memory may be encrypted.

Any two or more of the features described in this specification, including in this summary section, may be combined to form implementations not specifically described in this specification.

At least part of the devices, systems, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, and processes described in this specification may be configured or controlled using a computing system comprised of one or more processing devices and memory storing instructions that are executable by the one or more processing devices to perform various control operations. The devices, systems, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DETAILED DESCRIPTION

An example test system includes primary memory that stores test data for use by a test program. The primary memory, however, has limited storage capacity. Accordingly, the test system also includes a secondary memory, which may be separate or different from the primary memory, and which may have a greater storage capacity than the primary memory. The test data can be stored in the secondary memory until it is needed for use, at which point all or part of the test data is transferred from the secondary memory to the primary memory. The example processes described herein use historical data relating to execution of the test program to predict when the test data, or a portion thereof, will be needed. Based on that prediction, the processes move the test data, or a portion thereof, from the secondary memory into the primary memory, and then retrieve the test data from the primary memory. As a result of the prediction, delays in test program execution may be reduced. For example, the test data may be available from secondary memory and need not be obtained from a remote source. Furthermore, the test data may be loaded for use from the secondary memory into the primary memory when the test data is predicted to be needed.

Figure 1:
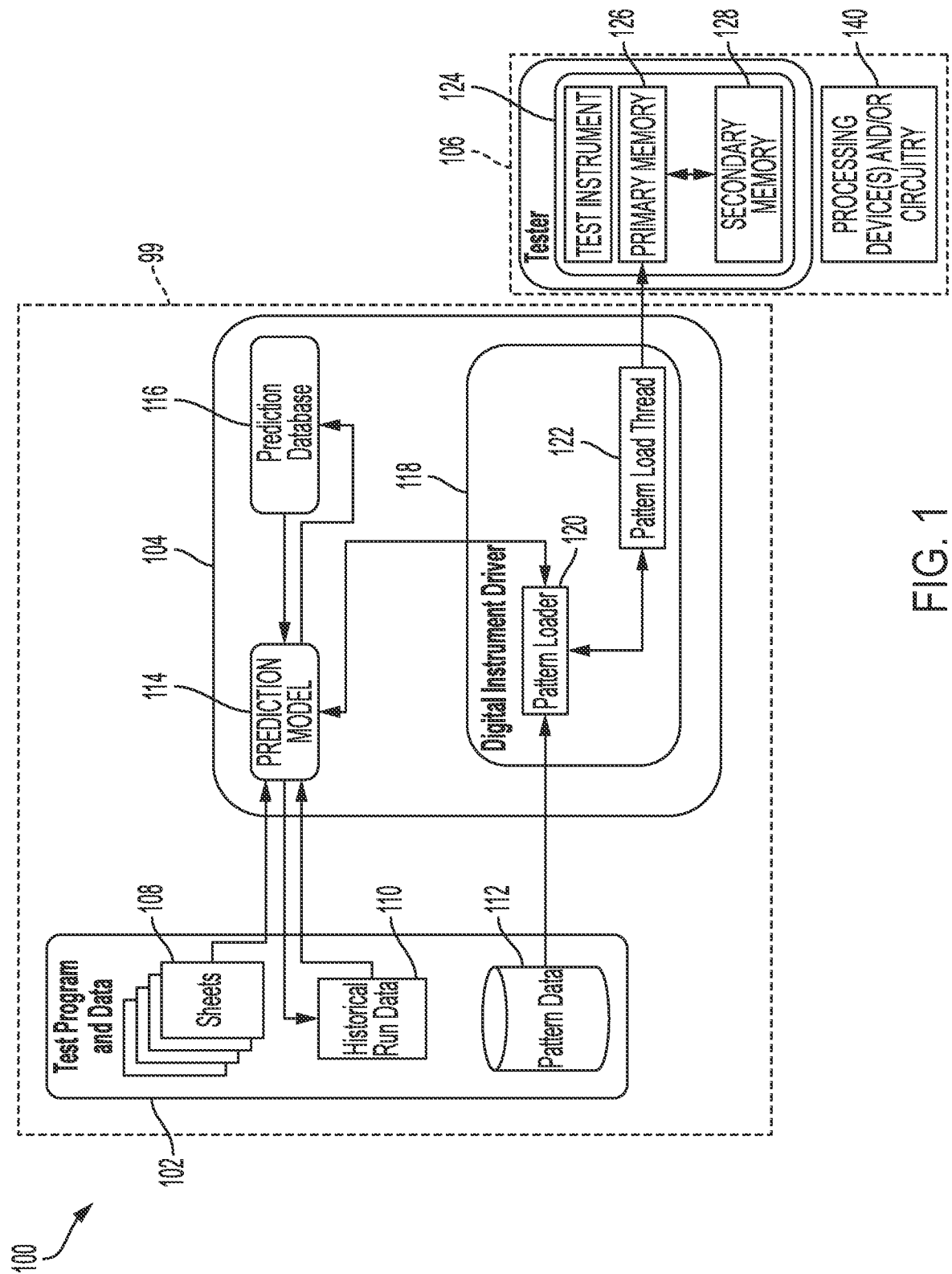
FIG. 1 is a block diagram of example components of a test system configured to store test data into primary memory or secondary memory on a tester.

FIG. 1 is a block diagram of example components 100 of a test system configured to test a device under test (not shown). Components 100 may be part of automatic test equipment (ATE) 300, an example of which is described with respect to FIG. 3 below. Components 100 include tester 106 and control system 99.

Figure 3:
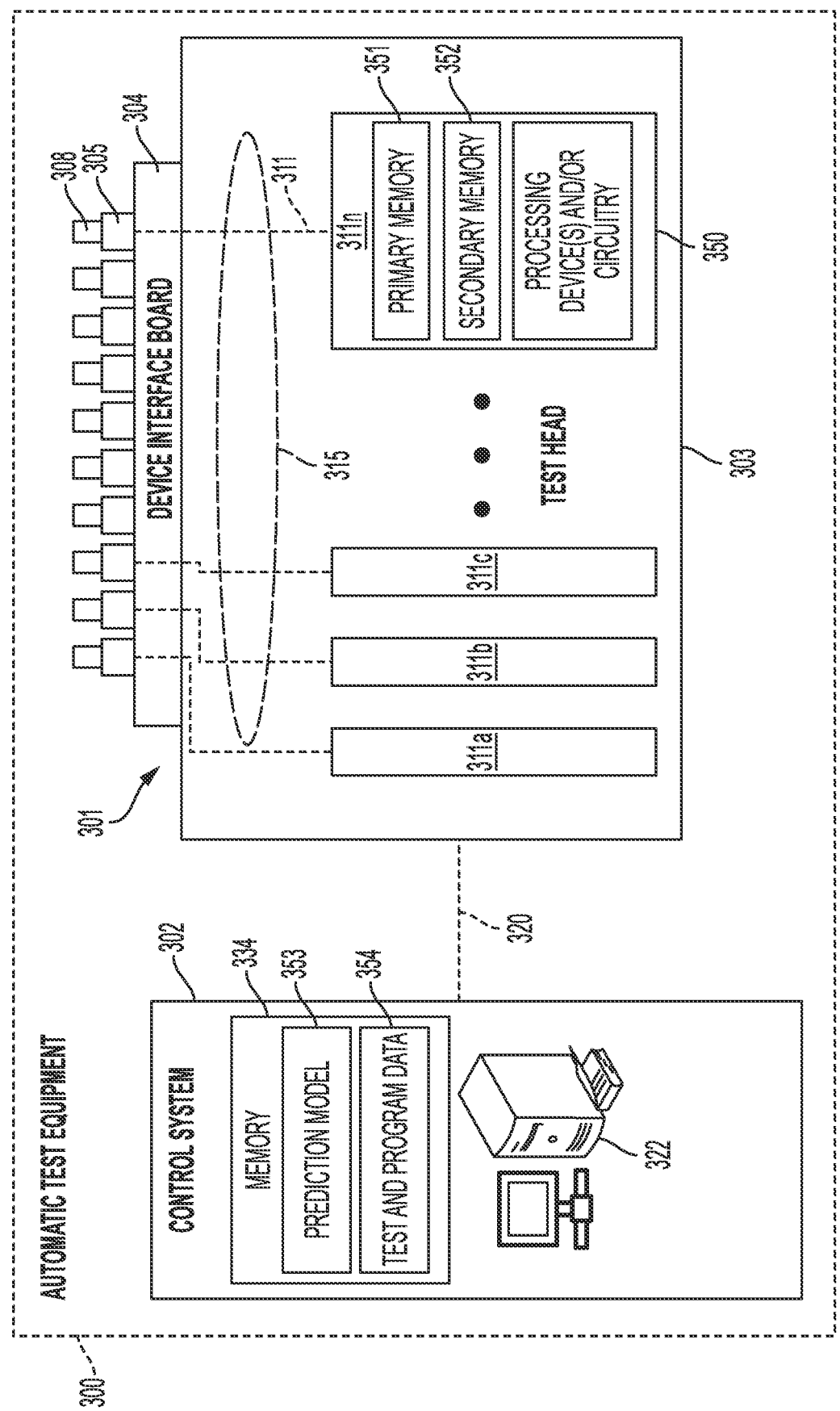
FIG. 3 is a block diagram showing an example test system.

Control system 99 may be a computing system of the type described herein, e.g., with respect to FIG. 3 containing memory to store test program and data 102 and prediction module 104. Test program and data 102 and prediction module 104 include executable software and/or data.

Tester 106 may be a hardware device. For example, tester 106 may be, or include, a test instrument 124 or multiple test instruments. A test instrument may include memory such as that described below, for storing test data and one or more test programs, and one or more processing devices and/or circuitry 140 for executing the one or more test programs using the test data in order to test one or more DUTs. Examples of processing devices are described herein.

In some implementations, the memory on test instrument 124 includes primary memory 126 and secondary memory 128. Primary memory 126 may be dynamic random access memory (DRAM) cache or any other appropriate type of storage into which test data may be stored. Secondary memory 126 may also be DRAM cache or any other appropriate type of storage into which test data may be stored. In some implementations, secondary memory 128 may have a storage capacity that is greater than that of primary memory 126. For example, secondary memory 128 may have a storage capacity that is two times greater than the storage capacity of primary memory 126; secondary memory 128 may have a storage capacity that is three times greater than the storage capacity of primary memory 126; secondary memory 128 may have a storage capacity that is four times greater than the storage capacity of primary memory 126; and so forth.

In some implementations, primary memory 126 is directly accessible to control system 99. For example, control system 99 may store a test program and/or tests data into, and retrieve data from, primary memory 126. This may be done without reliance on, or permission from, processing device (s) and/or circuitry 140. In some implementations, secondary memory 128 is not directly accessible to control system 99. Accordingly, to access secondary memory 128—e.g., to cause a test program and/or test data to be stored into or moved from the secondary memory-control system 99 must instruct processing device(s) and/or circuitry 140 on test instrument 124. For example, to cause a test program and/or test data to be stored into or moved from the secondary memory, the control system instructs processing device(s) and/or circuitry 140 on test instrument 124. The processing device(s) and/or circuitry 140 on test instrument 124 accesses the primary memory and the secondary memory to perform the instructed action. In some implementations, both primary memory 126 and secondary memory 128 may be directly accessible to control system 99.

Test program and data 102 includes data and executable instructions that constitute one or more test programs to test the DUT. In this example, test program and data 102 also includes sheets 108, historical run data 110, and pattern data 112.

Sheets 108 contain information used by a test system to perform testing on a DUT. In this regard, each test program may require several classes of data to describe the DUT, the test system, and a test setup. The sheets include this formation, e.g., in spreadsheet format. For example, the sheets specify a set of data for the physical interconnection of DUT physical pins with test instrument(s). The sheets specify the configuration of the test system, e.g., the test instruments that are physically located within the test system. The sheets also specify each test to be performed on the DUT and the order of in which those tests—for example, a test flow—are to be run. The sheets may contain a flow table that references pattern data and executable instructions that are part of one or more test program(s) for testing the DUT.

Pattern database 112 stores test data, such as pattern data, for each test program. Pattern data includes input (or test) data sequences that, when applied to a DUT by a test program, enables the test system to distinguish between correct DUT behavior and erroneous DUT behavior caused, e.g., by defects in the DUT.

Historical run data 110 includes data collected from past execution of the test program(s) defined by test program and data 102. For example, the data may be collected from tens, hundreds, thousands, or more past executions of the test program(s) on DUTs of a same type. DUTs of a same type may include, for example, microprocessors by different or the same manufacturers. In this regard, test programs are typically designed by a DUT manufacturer for a particular DUT; however, that need not always be the case. For test programs designed by a DUT manufacturer for a particular DUT, the DUTs may be of the same type and from the same manufacturer.

Historical run data 110 may include, for example, one or more sequences of operations that a test program takes when executing testing. For example, a sheet may define branches within a test flow of a test program. The branches indicate what operations to perform in the event of a specific condition at the start of a branch. For example, the sheet may define a loop within a flow of the test program. The loop indicates how many times to perform a set of operations based on a specific condition associated with the loop. The historical run data may indicate loops, branches, etc. that were taken in prior executions of the test program and how often.

Historical run data 110 may be stored as a binary file, and may be used as training data in predicting future executions of the flow. For example, the historical run data may be used to train a machine learning model, as described herein.

Prediction module 104 is a programming module comprised of executable instructions that is configured to predict which operations will be executed when testing a DUT based on the test program and data 102 and, in particular, the historical run data. In some implementations, prediction module 104 is configured to use pattern execution prediction based on a probabilistic model to predict a pattern load sequence to achieve repeatable test times, thereby improving a cost of test (COT). In this regard, cost of test may include, for example, how much money it takes to test each DUT, the time it takes to test each DUT, and/or other metrics that affect test performance.

In some implementations, prediction module 104 includes prediction model 114, prediction database 116, and digital instrumentation driver 118. Prediction model 114 may be a computer program comprised of instructions that are executable defining a machine learning model; digital instrumentation driver 118 may also be a computer program comprised of instructions that are executable; and prediction pattern database 116 may be a collection of data and/or executable instructions.

Prediction model 114 is configured to receive sheets 108 associated with the test program, to analyze a test program flow based on the sheets, and to create and to update probability-based prediction tables for each inflection (e.g., branch, loop, etc.) point in the test program. For example, prediction model 114 is configured to perform a static analysis of the test program based on sheets 108. Prediction model 114 tracks each path through the test program based on sheets 108, including where the program separates into multiple branches or returns for a loop. Prediction model 114 therefore may identify all possible paths through the test program and creates a record of all of the possible paths through the test program.

When creating the record, prediction model 114 uses historical run data 110 to identify paths through the test program that are most likely to be taken, and to assign weights to individual paths based on the likelihood that individual paths will be taken. The likelihood that those paths will be taken is based on the historical data. For example, the paths through the test program that have historically been taken less, will have a less likelihood of being taken currently or in the future. Conversely, the paths through the test program that have historically been taken more, will have a greater likelihood of being taken currently or in the future. Accordingly, the paths that are less likely to be taken will have lower assigned weights than the paths that are more likely to be taken. And, conversely, the paths that have a greater likelihood of being taken will have greater assigned weights than the paths that are less likely to be taken.

In some implementations, prediction model 114 may store and train a machine learning model based on the historical data. For example, the record of all of the possible paths through the test program that are weighted based on the historical run data may be applied to train a machine learning model—e.g., to generate a weighted model (also referred to as a "trained model"). The weighted model is usable to predict, based on the weighted paths, which paths will most likely be taken through the test program currently or in the future. For example, the machine learning model may include a Markov model that is trainable based on the data collected from past execution of the test program(s) noted above and that relies on a stochastic process for predicting future execution for current pattern data. For example, the machine learning model may include a Bayesian model where outcome values may be simulated from a posterior predictive distribution, which is the distribution of unobserved (future) pattern data given historical data. For example, prediction database 116 may include a probability model that is trainable based on the data collected from the past execution of the test program(s) noted above. The prediction model may be or include any appropriate one or more machine-learning or trainable model(s).

Prediction database 116 may be or include a relational database or a multi-dimensional database. Prediction database 116 may store, for example, the machine learning model that has been trained by prediction model 114. In some implementations, prediction database may store prediction data obtained by applying the machine learning model to current pattern data.

Digital instrumentation driver 118 is software that includes pattern loader 120 and pattern load thread 122 in this example.

Pattern loader 120 is configured to receive test program pattern data 112 from memory. Pattern loader 120 is configured to send the pattern data to the prediction model 114 or prediction database 116 to apply the weighted machine learning model to the pattern data to predict which of the pattern data is going to be needed during execution of a test program. The predictions of pattern data will be needed for execution of the test program may be obtained, e.g., from the prediction model 114 and/or the prediction database 116 and sent back to the pattern loader.

Pattern load thread 122 may be a background thread that manages movement of test patterns and program instructions among two or more memories 126, 128 in tester 106. This thread continuously tries to keep pattern data in the primary memory that the test program may most likely need next for processing. To this end, pattern load thread 122 is configured load to pattern data for the test program into primary memory 126 or secondary memory 128 based on the likelihood and time that the pattern data will be needed execution. As noted, control system 99 may instruct processing device(s) and circuitry 140 on tester 106 to store the executable instructions in secondary memory 128 if that is their current destination.

Figure 2:
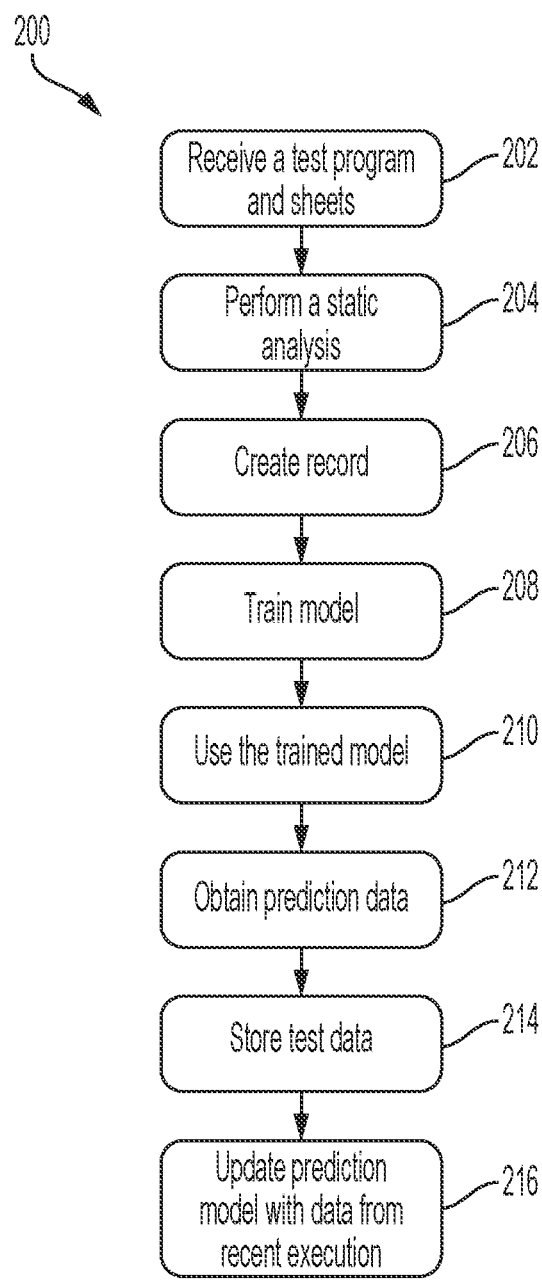
FIG. 2 is a flowchart of an example process for storing test data into primary memory or secondary memory on a tester.

FIG. 2 is a flowchart of an example process 200 for causing test data (e.g., pattern data) associated with the test program to be stored in a primary memory 126 or a secondary memory 128 based on paths predicted through the test program. In some implementations, process 200 may be implemented by control system 99 in combination with memory and processing device(s) and circuitry 140 on tester 106.

Process 200 includes prediction module 104 receiving (202) sheets 108 for a test program and historical run data for the test program. Prediction model 114 performs (204) a static analysis of the test program based on the sheets and executable instructions of the test program referenced in the sheets. A static program analysis is an analysis of a computer programs performed without executing the program. In some implementations, the static analysis may identify all paths through the test program that could be taken during a hypothetical execution of the test program.

Prediction model 114 creates (206) a record identifying paths that can be taken through the test program. As explained above the record weights paths through the test program based on the historical run data, with paths that are less likely to be taken having lower assigned weights than the paths that are more likely to be taken, and with the paths that have a greater likelihood of being taken having greater assigned weights than the paths that are less likely to be taken. In some implementations, in performing the static analysis, prediction model 114 may use a probabilistic model that predicts an optimal pattern load sequence to achieve repeatable test times.

The record created by prediction model 114 is used to train (208) a prediction model, such as a machine learning model, to predict future execution of test program instructions (e.g., for the same or similar DUT) based on the historical data. Examples of machine learning models are described above. The trained model may be stored in prediction database 116 in some implementations.

Process 200 includes using (210) the trained model in to predict paths through the test program that will be taken during a planned execution of the test program using given pattern data. The prediction model may produce prediction data for each branch it encounters. Pattern loader 120 obtains (212) the prediction data for the paths. For example, pattern loader 120 may request prediction model 114 to retrieve the prediction data for the paths from prediction databases 116.

Process 200 includes storing (214) test data, such as pattern data, associated with the test program in primary memory 126 or secondary memory 128 based on the prediction data. For example, pattern load thread 122 may load test data that is more likely to be needed for execution of a test program into primary memory 126 based, e.g., on a high likelihood that a test program is likely to take a path that requires the test data. For example, pattern load thread 122 may load test data that is less likely to be needed for execution of a test program into second memory 126 based. e.g., on a low likelihood that a test program is likely to take a path that requires the test data. In particular, pattern load thread 122 may instruct processing device(s) and/or circuitry in tester 106 to store the test data in secondary memory.

Pattern loader thread 122 may, e.g., continuously, assess the status of the executed pattern data in primary memory 126. This may be done based, e.g., by monitoring action execution of the test program executing on the test instrument and/or on the control system. Upon determining a pattern data stored in secondary memory cache 128 is needed for execution, pattern loader thread 122 may initiate moving the pattern data to primary memory 126 for execution, e.g., by instruct processing device(s) and/or circuitry in tester 106. For example, pattern loader thread 122 may cause at least some of the test data to be moved from the secondary memory into (e.g., back to) the primary memory based on a time of the planned execution. This may be done, for example, if it is predicted that the data from the second memory will be needed for the current execution of a test program. That is, the test program accesses its data from the primary memory, so moving the test data from the secondary memory to the primary memory may be necessary if the test data from the secondary memory is needed for the current execution. Pattern loader thread 122 may also cause at least some of the test data to be moved from the primary memory to the secondary memory prior to the planned execution. This may be done, for example, if it is predicted that the data from the primary memory will not be needed for the current execution of a test program and there is a need to free-up storage space in the primary memory. In this regard, at least some test data may be moved from the primary memory to the secondary memory when the primary memory does not have sufficient storage capacity.

In some implementations, pattern loader thread 122 may assess when a test program attempts to execute pattern data that is not loaded in either primary memory 126 or secondary memory 128. This is considered a pattern miss. The pattern loader thread 122 may communicate pattern misses back pattern to prediction model 114 via pattern loader 120. In this regard, process 200 may include updating (216) the prediction model using data from the recent execution of the test program. Prediction model 114 may update data in prediction database 116 based on the history from the recent test program execution, and any pattern misses to improve prediction in subsequent runs. Moreover, prediction model 114 may update historical run 110 data to reflect changes in the current run. The prediction model may use the updated information to be included in its training to fine-tune its predictive capabilities.

In some implementations, secondary memory 128 may store one or more test programs-referred to herein as a library of test programs—that can be loaded into the primary memory for execution when needed. For example, after a test program is loaded into secondary memory 128 as described herein, the test program may be copied into primary memory 126 for execution, and a copy of that test program may remain/persist in secondary memory 128 for subsequent use. This may be the case for multiple test programs such that secondary memory 128 accumulates a library of test programs that can be copied/loaded into primary memory 126 as needed for execution. As such, when a new device is tested, an existing test program in secondary memory 128 may be used to test that device, thereby potentially reducing test time, since a new test program need not be loaded into the tester for execution. The existing test program may be selected by the control system to test the new device based, e.g., on user input, the identity of the device being tested, the identity of the device manufacturer, the test(s) to be performed, and/or other appropriate factors.

In some implementations, access to one or more test programs in secondary memory 128 may be restricted based on outside access capabilities. Access may require that a user-such as a test engineer or a manufacturer-provide authentication information associated with one or more test programs prior to allowing access to those test programs and copying those test programs to the primary memory. For example, before accessing test program(s) in secondary memory 128, a user may be prompted, e.g., by the tester via an associated or attached computing system, to input one or more identifier(s), such as a user name and password. In some implementations, only after the user name and password are authenticated may the user execute test programs (e.g., copy the test programs to the primary memory for execution) from the library associated with that user name and password.

In some implementations, the test programs in secondary memory 128 may be encrypted. For example, the test programs may be encrypted using a public key. Only a holder of a private key, which can decrypt the encrypted test programs, may be able to execute these test programs (e.g., copy the test programs to the primary memory for execution). The encryption may be combined with a user name and password, as described above, for additional security. In another example, secret symmetric key encryption may be used to encrypt the test programs in the secondary memory 128. The encryption system will follow NIST (National Institute of Standards and Technology) guidelines for key management systems.

FIG. 3 is a block diagram showing components of example ATE 300 that includes a test device (referred to herein as a "tester") 301 and a control system 302. The components 100 of FIG. 1 may be part of ATE 300. Tester 301 may be an implementation of tester 106; and control system 302 may be an implementation of control system 99.

Tester 301 includes a test head 303 and a device interface board (DIB) 304 connected physically and electrically to test head 303. In this example, DIB 304 includes a circuit board that includes mechanical and electrical interfaces at sites 305. One or more DUTs, such as DUT 308, connect to each of those sites for testing by the ATE. DIB 304 may include, among other things, connectors, conductive traces, conductive layers, and circuitry for routing signals between test instruments in the test head 303, DUTs connected to DIB sites, and other circuitry in the ATE. Power, including voltage and current, may be run via one or more layers in the DIB to DUTs connected to the DIB.

Test head 303 includes multiple test instruments 311*a* to 311*n*, each of which may be configured, as appropriate, to implement testing and/or other functions. Although only four test instruments are shown, ATE 300 may include any appropriate number of test instruments, including one or more residing outside of test head 315.

The test instruments may be hardware devices that may include one or more processing devices and/or other circuitry. The test instruments may be configured—for example, programmed—to output commands to test DUTs held on the DIB. The commands to test the DUTs may be or include instructions, signals, data, parameters, variables, test patterns, and/or any other information designed to elicit response(s) from the DUT. One or more—for example, all of—the test instruments may be configured to receive, from the DUT, responses to the commands sent from the ATE to the DUT. The responses are in the form of response data. The test instruments may be configured to analyze the response data to determine whether the DUT has passed or failed testing. The test instruments may be configured to send the response data to control system 302 for analysis in accordance with process 200.

In some implementations, all or part of process 200 may be performed using one test instrument or in multiple test instruments. In this regard, taking test instrument 311*n* as representative of all test instruments, each test instrument (or a subset thereof) may include one or more processing device(s) and/or other circuitry 350, primary memory 351, and secondary memory 352, like those of FIG. 1. In some implementations, the functionality attributed to control system 99 may also or instead be implemented on a test instrument, e.g., the test instrument may include test and program data 102 and prediction module 104 that operate as described herein.

Test channels 315 are configured between the test head and the DIB to enable communication between the DUTs and the test instruments. Although only four test channels are shown in FIG. 3, any number of test channels may be included, e.g. one or more test channels per DUT.

Control system 302 is configured to—e.g., programmed to—communicate with test instruments 311*a* to 311*n* to direct and/or to control testing of the DUTs. In some implementations, this communication 320 link may be over direct connection such as a high-speed serial bus of the type described herein. In some implementations, this communication link may be over a network. In some implementations, this communication link may be considered part of one or more of the test channels. In some implementations, this communication link may not be considered part of one or more of the test channels.

Control system 302 may be configured to provide test programs, commands, and/or test data (e.g., test patterns) to test instruments 311*a* to 311*n* in the test head, which the test instrument(s) use to test the DUTs. Control system 302 may be configured to receive response data from test instrument (s) and to analyze the response data to determine whether DUTs have passed or failed testing. Control system 302 may also be configured to perform all or part of the operations process 200 of FIG. 2 described previously. Accordingly, control system 302 may include memory 332 storing a prediction model 353 and test and program data 354 like that of FIG. 1. In some implementations, the functionality attributed to control system 302 may be implemented in each test instrument or distributed across two or more test instruments.

Although process 200 describes storing data between two memories, process 200 may be used to store data among three or more memories. For example, process 200 may be used to move data between two secondary memories and a primary memory, thereby enabling increased storage capacity on the tester.

All or part of the test systems and processes described in this specification and their various modifications may be configured or controlled at least in part by one or more computers such as control systems 99 or 302 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage devices, such as EPROM (erasable programmable read-only memory), EEPROM (electrically erasable programmable read-only memory), and flash storage devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system comprising:
a first memory comprising primary storage;
a second memory comprising secondary storage, the first memory and the second memory comprising different storage devices; and
a control system comprising one or more processing devices for predicting paths through a test program that will be taken during a planned execution of the test program, and for causing test data associated with the test program to be stored in the first memory or the second memory based on the paths predicted;
wherein causing the test data to be stored comprises:
causing the test data to be stored in the first memory;
causing at least some of the test data to be moved from the first memory to the second memory prior to the planned execution; and
causing the at least some of the test data to be moved from the second memory back to the first memory based on a time of the planned execution.

2. The system of claim 1, wherein the at least some of the test data is caused to be moved from the first memory to the second memory based on a storage capacity of the first memory.

3. The system of claim 2, wherein the at least some of the test data is caused to be moved from the first memory to the second memory prior to the planned execution when the first memory is full.

4. The system of claim 2, wherein the at least some of the test data is caused to be moved from the first memory to the second memory when the first memory does not have enough storage capacity for both the at least some of the test data and other test data, the other test data being predicted to be needed by the test program before the at least some of the test data.

5. The system of claim 1, wherein the at least some of the test data is caused to be moved from the second memory back to the first memory at a time prior to the time of the planned execution.

6. The system of claim 1, wherein the second memory has greater storage capacity than the first memory.

7. The system of claim 1, wherein the control system is configured to execute a model for predicting the paths through the test program.

8. The system of claim 7, wherein the model comprises at least one of a probability model, a Markov model, a Bayesian model, or a machine learning model.

9. The system of claim 7, wherein the model comprises parameters that are obtained through a static analysis of the test program.

10. The system of claim 9, wherein the parameters are weighted based on historical data, the historical data being based on prior executions of the test program.

11. The system of claim 1, wherein the second memory stores multiple test programs including the test program; and
wherein the control system is configured to determine which of the multiple test programs to copy to the first memory based on one or more factors, and to copy one or more of the test programs from the second memory to the first memory based on the one or more factors.

12. The system of claim 11, wherein the one or more factors comprise user input.

13. The system of claim 11, wherein the one or more factors comprise an identity of a device to be tested by the one or more test programs.

14. The system of claim 11, wherein the one or more factors comprise an identity of a manufacturer of a device to be tested by the one or more test programs.

15. The system of claim 11, wherein the control system is configured to receive information to authenticate a user prior to copying one or more of the multiple test programs to the first memory.

16. The system of claim 11, wherein the multiple test programs in the secondary memory are encrypted.

17. A system comprising:
a first memory comprising primary storage;
a second memory comprising secondary storage, the primary memory and the secondary memory comprising different storage devices;
a control system comprising one or more processing devices for predicting paths through a test program that will be taken during a planned execution of the test program, and for causing test data associated with the test program to be stored in the first memory or the second memory based on the paths predicted;

wherein the control system is also configured to perform operations comprising:

performing a static analysis of the test program, the static analysis identifying first paths through the test program that could be taken during a hypothetical execution of the test program;

obtaining historical data that is based on second paths through the test program that have been taken during past executions of the test program; and weighting the first paths based on the historical data to produce a model;

wherein predicting the paths through the test program is performed based on the model.

18. The system of claim 17, wherein performing the static analysis comprises identifying a branch in the test program, the branch splitting into multiple paths that the test program may follow, the first paths comprising the multiple paths.

19. The system of claim 17, wherein the test program is packaged with the historical data and the test data; and wherein the historical data is obtained from the test program.

20. A method comprising:

performing a static analysis of a test program, the static analysis identifying first paths through the test program that could be taken during a hypothetical execution of the test program;

obtaining historical data that is based on second paths through the test program that have been taken during past executions of the test program;

weighting the first paths based on the historical data to produce a model;

using the model to predict third paths through the test program that will be taken during a planned execution of the test program; and storing test data associated with the test program in memory based on the third paths.

21. The method of claim 20, wherein the memory comprises first memory and second memory, the first memory and the second memory comprising different storage devices; and wherein storing the test data comprises storing the test data in the first memory, at least some of the test data being retrieved from the first memory during execution of the test program.

22. The method of claim 21, further comprising:

moving the at least some of the test data from the first memory to the second memory prior to the planned execution; and moving the at least some of the test data from the second memory back to the first memory based on a time of the planned execution.

23. The method of claim 21, wherein the second memory has greater storage capacity than the first memory.

24. The method of claim 22, wherein the at least some of the test data is moved from the first memory to the second memory when the first memory is full.

25. The method of claim 22, wherein moving the at least some of the test data from the second memory back to the first memory occurs prior to the time of the planned execution.

26. The method of claim 24, wherein the at least some of the test data is moved from the first memory to the second memory when the first memory does not have the storage capacity for both the at least some of the test data and other test data, the other test data being predicted to be needed by the test program before the at least some of the test data.

27. The method of claim 20, wherein performing the static analysis comprises identifying a branch in the test program, the branch splitting into multiple paths that the test program may follow, the first paths comprising the multiple paths.

28. The method of claim 20, wherein the model comprises at least one of a probability model, a Markov model, a Bayesian model, or a machine learning model.

29. The method of claim 20, wherein the test program is packaged with the historical data and the test data; and wherein the historical data is obtained from the test program.

* * * * *